United States Patent [19]

Fuchigami

[11] Patent Number: 5,400,287
[45] Date of Patent: Mar. 21, 1995

[54] METHOD FOR ERASING AND VERIFYING NONVOLATILE SEMICONDUCTOR MEMORY DEVICE

[75] Inventor: Keisuke Fuchigami, Kanagawa, Japan

[73] Assignee: NEC Corporation, Tokyo, Japan

[21] Appl. No.: 205,956

[22] Filed: Mar. 3, 1994

[30] Foreign Application Priority Data

Mar. 3, 1993 [JP] Japan .................................. 5-041626

[51] Int. Cl.$^6$ ............................................ G11C 13/00
[52] U.S. Cl. ..................................... 365/218; 365/900
[58] Field of Search ...................... 365/189.01, 230.01, 365/900, 201

[56] References Cited

U.S. PATENT DOCUMENTS 5,327,384  7/1994  Ninomiya ............................. 365/900

Primary Examiner—Terrell W. Fears

[57] ABSTRACT

In a nonvolatile semiconductor memory device including nonvolatile memory cells, a predetermined number of the memory cells are simultaneously erased. Then, a verification address VADD is generated, and one of the memory cells is selected and read in accordance with the verification address. It is determined whether or not data read from a selected memory cell coincides with a predetermined value. As a result, when this data coincides with the predetermined value, the verification address is renewed, i.e., incremented or decremented, to thereby repeat a verification operation. Otherwise, the predetermined number of the memory cells are again simultaneously erased, but a verifying operation is carried out by using the same verification address.

12 Claims, 13 Drawing Sheets

Fig. 4A
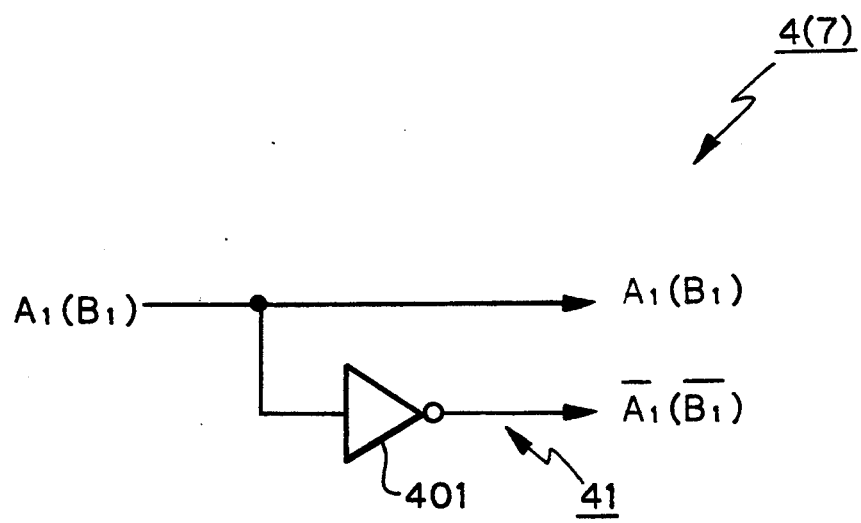
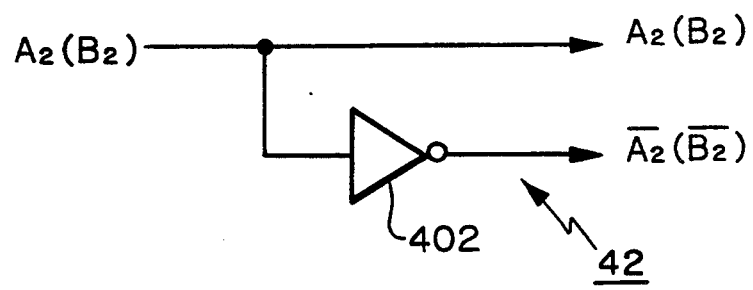
Fig. 4B

1

METHOD FOR ERASING AND VERIFYING NONVOLATILE SEMICONDUCTOR MEMORY DEVICE

BACKGROUND OF THE INVENTION

Field of the Invention

The present invention relates to a method for erasing and verifying a nonvolatile semiconductor memory device.

Description of the Related Art

In a nonvolatile semiconductor memory device, an electrical write operation can be carried out after the device is mounted on a printed circuit board. One typical example of such a device is a flash memory which has an advantage in that data storage is possible without a backup battery and which is highly integrated.

In such a flash memory, before a write operation, a flash erase operation is performed upon a predetermined sector of memory cells or all of the memory cells. In this case, the threshold voltages of the erased memory cells are fluctuated, and therefore, it is necessary to verify whether or not each of the erased memory cells is actually erased, i.e., data read therefrom is a predetermined value such as "0".

In a prior art method for erasing and verifying a nonvolatile semiconductor memory device, after a flash erase operation for a predetermined number of the memory cells, a verifying operation is carried out by generating a verification address VADD. First, the verification address VADD is initialized at 0, for example. Then, one of the memory cells is selected and read in accordance with the verification address VADD. Then, it is determined whether or not data read from the selected memory cell coincides with the value "0". As a result, when this read data coincides with the value "0", the verification address VADD is renewed, for example, incremented by 1, to thereby repeat the above-mentioned steps. Conversely, when the read data does not coincide with the value "0", a flash erase operation is again performed upon the predetermined number of the memory cells. Also, in this case, the verification address VADD is again initialized at 0, to thereby restart a verification operation all of the erased memory cells. This increases the time required for an erasing and verifying operation for the device.

SUMMARY OF THE INVENTION

It is, therefore, an object of the present invention to reduce the time required for an erasing and verifying operation in a nonvolatile semiconductor memory device.

According to the present invention, in a nonvolatile semiconductor memory device including nonvolatile memory cells, a predetermined number of the memory cells are simultaneously erased. Then, a verification address VADD is generated, and one of the memory cells is selected and read in accordance with the verification address VADD. It is determined whether or not data read from a selected memory cell coincides with a predetermined value. As a result, when this data coincides with the predetermined value, the verification address VADD is renewed, i.e., incremented, to thereby repeat a verification operation. Otherwise, the predetermined number of the memory cells are again simultaneously erased, but a verifying operation is carried out by using the same verification address VADD. Thus, a time required for an erasing and verifying operation for a nonvolatile semiconductor memory device can be reduced.

BRIEF DESCRIPTION OF THE DRAWINGS

The present invention will be more clearly understood from the description as set forth below with reference to the accompanying drawings, wherein:

FIG. 4 is a circuit diagram of the address buffer of FIG. 1;

DESCRIPTION OF THE PREFERRED EMBODIMENT

Figure 1:
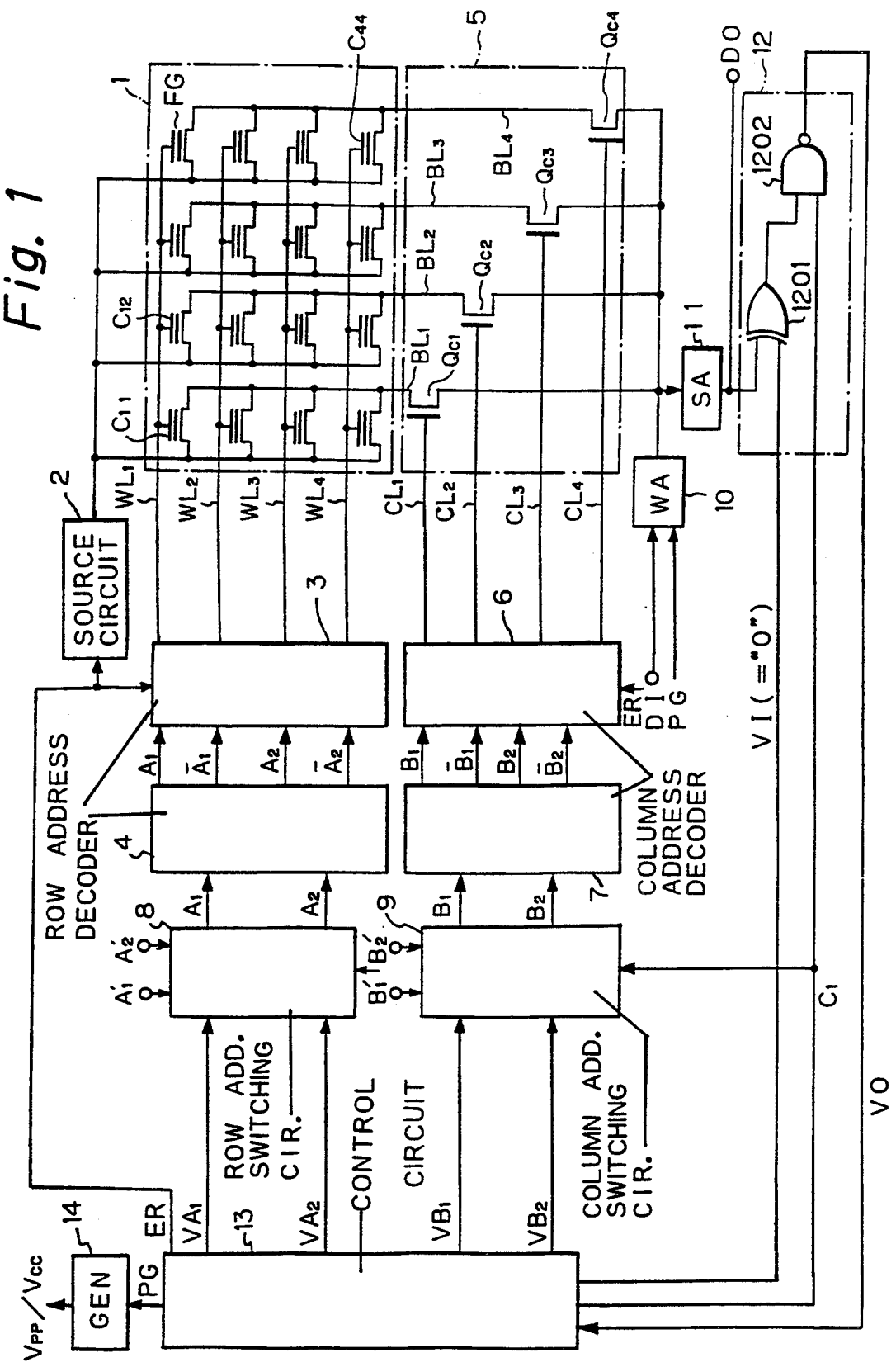
FIG. 1 is a block circuit diagram illustrating a nonvolatile semiconductor memory device to which a first embodiment according to the present invention is applied.

In FIG. 1, which is a block circuit diagram illustrating a nonvolatile semiconductor device to which a first embodiment of the present invention is applied, four word lines $WL_1$, $WL_2$, $WL_3$ and $WL_4$ and four bit lines $BL_1$, $BL_2$, $BL_3$ and $BL_4$ are provided. Reference numeral 1 designates a NOR type memory cell array formed by memory cells $C_{11}$, $C_{12}$, ..., $C_{44}$ each of which has a control gate connected to one of the word lines $WL_1$, $WL_2$, $WL_3$ and $WL_4$, a drain connected to one of the bit lines $BL_1$, $BL_2$, $BL_3$ and $BL_4$, a source connected to a source circuit 2, and a floating gate FG.

In an erase mode (ER="1"), the source circuit 2 generates a high voltage $V_{pp}$ such as 12 V and applies it to the sources of the memory cells $C_{11}$, $C_{12}$, ..., $C_{44}$. Otherwise, the source circuit 2 applies 0V to the sources of the memory cells $C_{11}$, $C_{12}$, ..., $C_{44}$. The detail of the source circuit 2 will be explained later.

A row address decoder 3 receives row address signals $A_1$ and $A_2$ and their inverted signals $\bar{A}_1$ and $A\bar{A}_2$ from a row address buffer 4, to thereby select one of the word lines $WL_1$, $WL_2$, $WL_3$ and $WL_4$. In an erase mode (ER="1") however the row address decoder 3 makes all of the word lines $WL$, $WL_2$, $WL_3$ and $WL$ low. The details of the row address decoder 3 and the row address buffer 4 are explained later.

The bit lines $BL_1$, $BL_2$, $BL_3$ and $BL_4$ are connected to column switching transistors $Q_{c1}$, $Q_{c2}$, $Q_{c3}$ and $Q_{c4}$, respectively of a column switching circuit 5.

A column address decoder 6 receives row address signals $B_1$ and $B_2$ and their inverted signals $\bar{B}_1$ and $\bar{B}_2$ from a column address buffer 7, to thereby select one of column selection lines $CL_1$, $CL_2$, $CL_3$ and $CL_4$, i.e. to select one of the column selecting transistors $Q_{c1}$, $Q_{c2}$, $Q_{c3}$ and $Q_{c4}$ and drive it. Also, in an erase mode (ER="1"), however the column address decoder 6 makes all of the column selection lines $CL_1$, $CL_2$, $CL_3$ and $CL_4$ low, i.e., turns OFF all of the column switching transistors $Q_{c1}$, $Q_{c2}$, $Q_{c3}$ and $Q_{c4}$, so that all of the drains of the memory cells $C_{11}$, $C_{12}$, ..., $C_{44}$ are in a floating state. The details of the column address decoder 6 and the column address buffer 7 will be explained later.

A row address switching circuit 8 selects a set of external row address signals $A_1'$ and $A_2'$ or a set of row verification address signals $VA_1$ and $VA_2$. That is, in a verification mode ($C_1$="1"), the row address switching circuit 8 selects the row verification address signals $VA_1$ and $VA_2$ and transmits them to the row address buffer 4. Otherwise ($C_1$="0"), the row address switching circuit 8 selects the external row address signals $A_1$ and $A_2$ and transmits them to the row address buffer 4. The details of the row address switching circuit 8 will be explained later.

Similarly, a column address switching circuit 9 selects a set of external column address signals $B_1'$ and $B_2'$ or a set of column verification address signals $VB_1$ and $VB_2$. That is, in a verification mode ($C_1$="1"), the column address switching circuit 9 selects the column verification address signals $VB_1$ and $VB_2$ and transmits them to the column address buffer 7. Otherwise ($C_1$="0"), the column address switching circuit 9 selects the external row address signals $B_1$ and $B_2$ and transmits them to the column address buffer 7. The details of the column address switching circuit 9 will be explained later.

That is, in an erase mode (ER="1"), in all of the memory cells $C_{11}$, $C_{12}$, ..., $C_{44}$, the voltages at the sources are made the high voltage $V_{pp}$, the voltages at the control gates are made low (0 V), and the drains are in a floating state, so that all of the memory cells $C_{11}$, $C_{12}$, ..., $C_{44}$ are erased simultaneously. Otherwise, i.e., in a read/write mode (ER="0") including a verification mode ($C_1$="1"), one of the memory cells $C_{11}$, $C_{12}$, ..., $C_{44}$ is selected by the row address decoder 3 and the column address decoder 6.

The bit lines $BL_1$, $BL_2$, $BL_3$ and $BL_4$ are connected via the column switching transistors $Q_{c1}$, $Q_{c2}$, $Q_{c3}$ and $Q_{c4}$ to a write amplifier 10 and via a sense amplifier 11 to a verification circuit 12. Note that the sense amplifier 11 is of a current sensing type. The detail of the write amplifier 10 will be explained later.

The verification circuit 12 includes an exclusive OR circuit 1201 for receiving data from the sense amplifier 11 and a verification input data VI which is, in this case, "0", and a NAND circuit 1202 for receiving an output of the exclusive OR circuit 1201 and a verification control signal $C_1$ for a verification mode. That is, when an erase operation is performed upon one memory cell, the threshold voltage thereof is reduced, i.e., the data thereof is "0". Therefore, a verification for a flash erase operation can be made by determining whether or not data read out of each memory cell is "0". Note that, if data is read out of a completely erased memory cell, the output of the exclusive OR circuit 1201 is "0", and therefore, a verification output signal VO of the NAND circuit 1202 is "1". Conversely, if data is read out of an incompletely erased memory cell, the output of the exclusive OR circuit 1201 is "1", and therefore, the verification output signal VO of the NAND circuit 1202 is "0".

An erase signal ER for an erase mode, the verification control signal $C_1$ for a verification mode, and the verification address signals $VA_1$, $VA_2$, $VB_1$ and $VB_2$ are generated by a control circuit 13, which also receives the verification output signal VO from the verification circuit 12. Further, the control circuit 13 generates a program signal PG and transmits it to a $V_{pp}/V_{cc}$ voltage generating circuit 14 and the like. Note that the $V_{pp}/V_{cc}$ voltage generating circuit 14 generates a high voltage $V_{pp}$ such as 12 V in a program mode (PG="1"), and a low voltage $V_{cc}$ such as 5 V in a non-program mode (PG="0"). The details of the $V_{pp}/V_{cc}$ voltage generating circuit 14 will be explained later.

Next, each block of the device of FIG. 1 will be explained with reference to FIGS. 2 through 7.

Figure 2A:
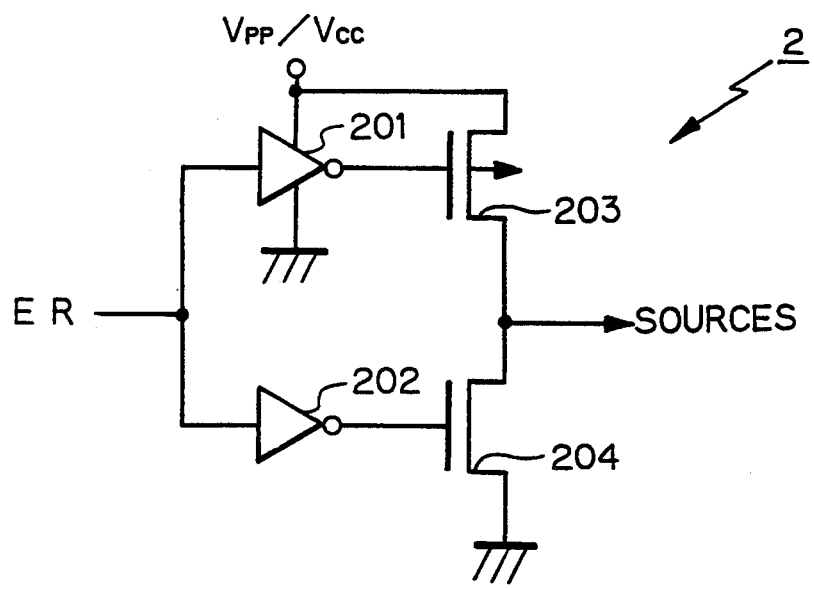
FIG. 2 is a circuit diagram of the source circuit of FIG. 1.
Figure 2B:
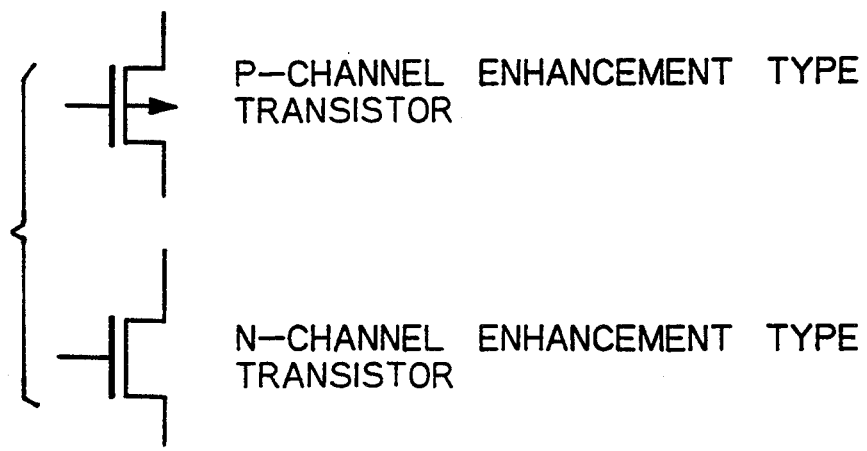

In FIG. 2, which is a detailed circuit diagram of the source circuit 2 of FIG. 1, this circuit 2 includes an inverter 201 powered by the voltage $V_{pp}/V_{cc}$, an inverter 202, a P-channel enhancement type transistor 203 controlled by an output of the inverter 201, and an N-channel enhancement type transistor 204 controlled by an output of the inverter 202. In an erase mode (ER="1"), the output of the inverter 201 is low (=0 V) and the output of the inverter 202 is low (=0 V), so that the transistors 203 and 204 are turned ON and OFF, respectively. Therefore, the voltages at the sources of the memory cells $C_{11}$, $C_{12}$, ..., $C_{44}$ are high (=$V_{pp}/V_{cc}$). Note that, in this case, the program signal PG is made high (="1"), and thus, $V_{pp}/V_{cc}=V_{pp}$. Conversely, in a nonerase mode (ER="0"), the output of the inverter 201 is high (=$V_{pp}/V_{cc}$) and the output of the inverter 202 is high (=$V_{cc}$), so that the transistors 203 and 204 are turned OFF and ON, respectively. Therefore, the voltages at the sources of the memory cells $C_{11}$, $C_{12}$, ..., $C_{44}$ are low (=0 V).

Figure 3:
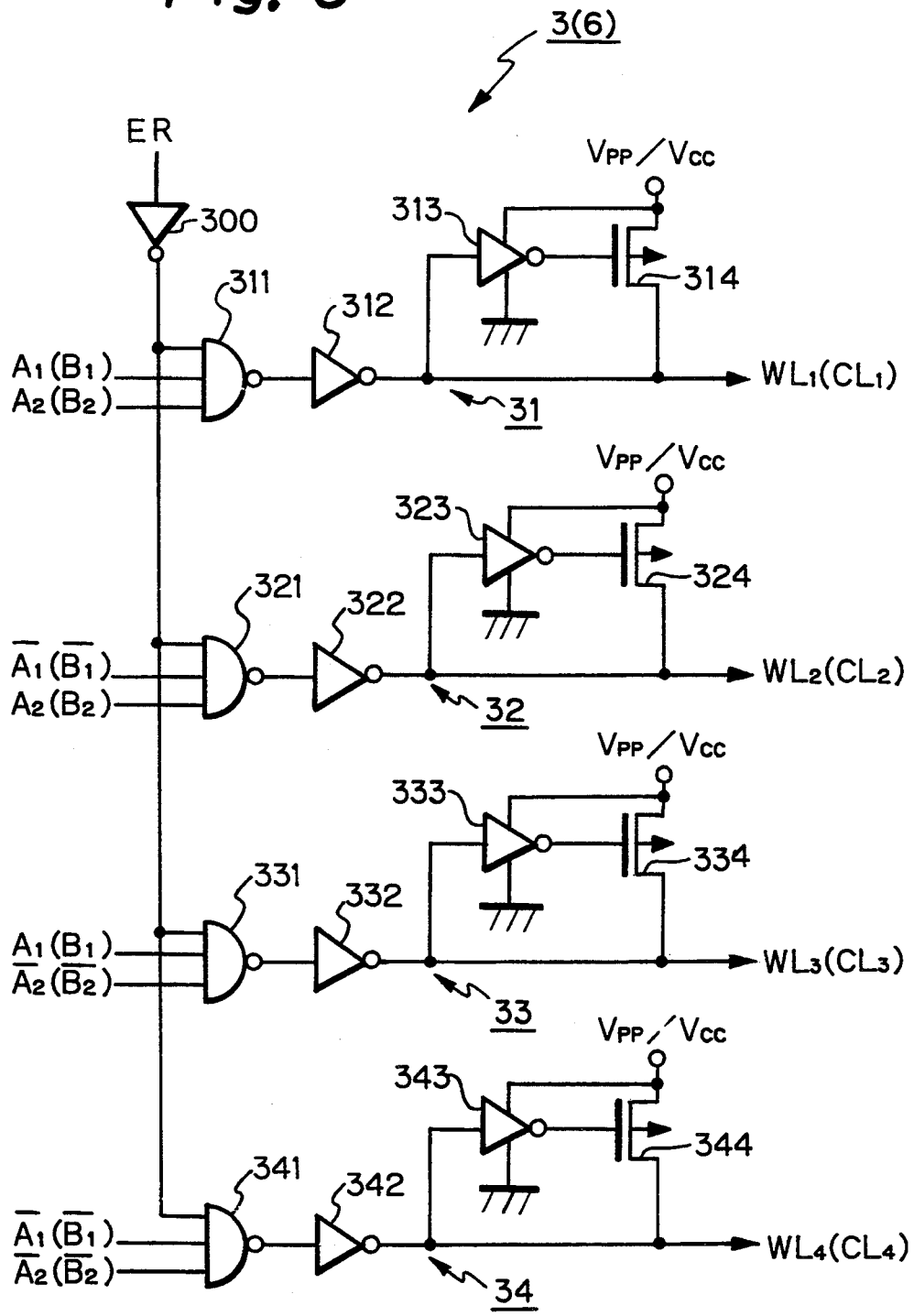
FIG. 3 is a circuit diagram of the address decoder of FIG. 1.

In FIG. 3, which is a detailed circuit diagram of the row address decoder 3 (the column address decoder 6) of FIG. 1, this address decoder 3 (6) is of a NAND logic type which includes four circuits 31, 32, 33 and 34 for the word lines $WL_1$, $WL_2$, $WL_3$ and $WL_4$ (or the column selection lines $CL_1$, $CL_2$, $CL_3$ and $CL_4$), respectively. The circuits 31 through 34 have the same configuration. For example, the circuit 31 includes a NAND circuit 311 for receiving the address signal $A_1$ and $A_2$ ($B_1$ and $B_2$), an inverter 312, an inverter 313 powered by the voltage $V_{pp}/V_{cc}$, and a P-channel enhancement type transistor 314. The NAND circuit 311 also receives an inverted signal of the erase signal ER via an inverter 300. Therefore, in an erase mode (ER="1"), all of the NAND circuits 311 through 341 are disabled, so that all of the word lines $WL_1$, $WL_2$, $WL_3$ and $WL_4$ (the column selection lines $CL_1$, $CL_2$, $CL_3$ and $CL_4$) are made low (=0 V). In this case, since the column selection transistors $Q_{c1}$, $Q_{c2}$, $Q_{c3}$ and $Q_{c4}$ are turned OFF, the drains of the memory cells $C_{11}$, $C_{12}$, ..., $C_{44}$ are in a floating state. Conversely, in a non-erase mode (ER="0"), i.e., in a read/write mode, the output of one of the NAND circuits 311 through 314 is made high in accordance with the address signals $A_1$ and $A_2$, i.e., the voltage at one of the word lines $WL_1$, $WL_2$, $WL_3$ and $WL_4$ (the voltage at one of the column selection lines $CL_1$, $CL_2$, $CL_3$ and $CL_4$) is made high (=$V_{pp}/V_{cc}$. As a result, one of the memory cells $C_{11}$, $C_{12}$, ..., $C_{44}$ is selected, and a read/write operation is performed thereupon.

In FIG. 4, which is a detailed circuit diagram of the row address buffer 4 (the column address buffer 7) of FIG. 1, this address buffer 4 (7) includes two circuits 41 and 42 each of which is formed by inverters 401 and 402. Therefore, the address buffer 4 (7) generates the address signals $A_1$ and $A_2$ ($B_1$ and $B_2$) and their inverted signals $\overline{A_1}$ and $\overline{A_2}$ ($\overline{B_1}$ and $\overline{B_2}$).

Figure 5A:
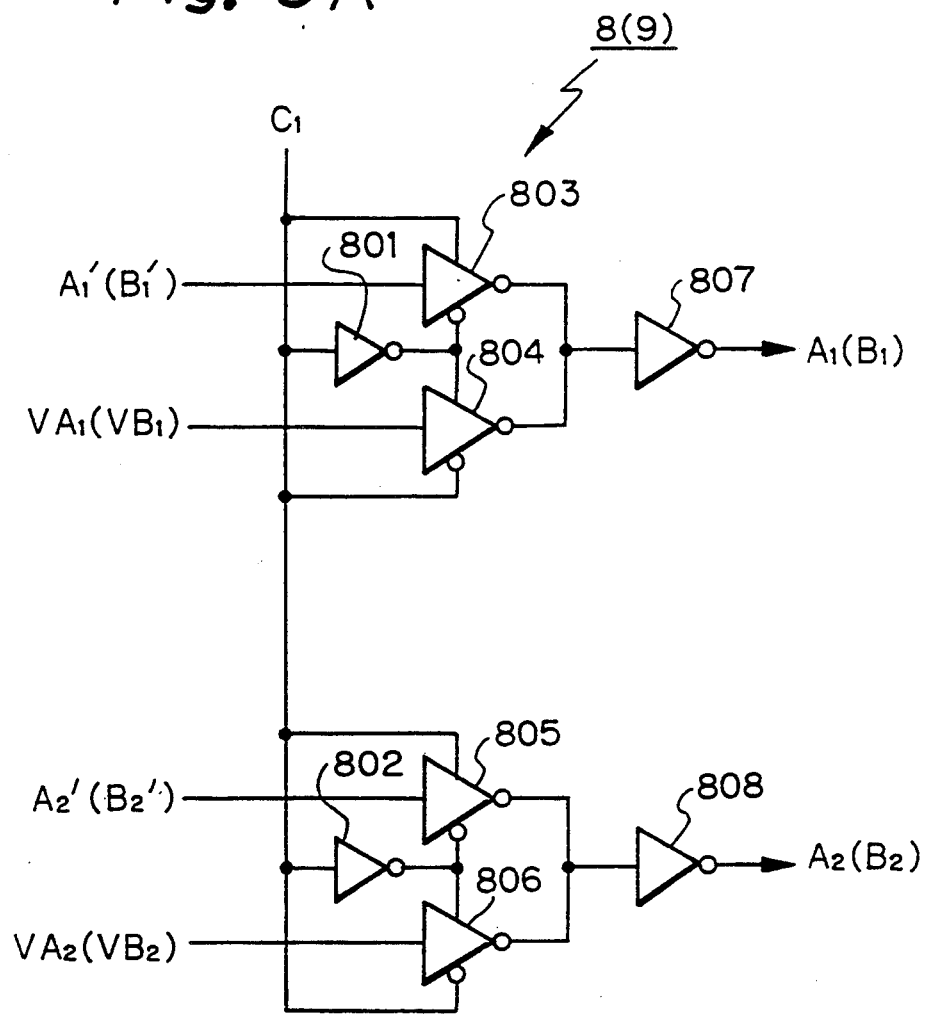
FIG. 5 is a circuit diagram of the address switching circuit of FIG. 1.
Figure 5B:
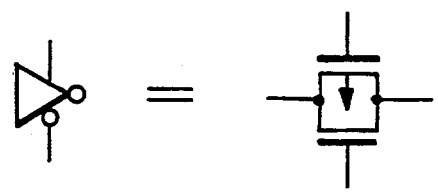

In FIG. 5, which is a detailed circuit diagram of the row address switching circuit 8 (the column address switching circuit 9) of FIG. 1, this address switching circuit 8 (9) includes two inverters 801 and 802 for receiving the verification control signal $C_1$, four transfer gates 803, 804, 805 and 806 controlled by the erase signal ER and its inverted signal, and two inverters 807 and 808. For example, in a verification mode (C="1"), the transfer gates 803 and 805 are turned OFF and the transfer gates 804 and 806 are turned ON, and therefore, the verification address signals $VA_1$ and $VA_2$ ($VB_1$ and $VB_2$) pass through the transfer gates 804 and 806, respectively. As a result, the address signals $A_1$ and $A_2$ ($B_1$ and $B_2$) are the same as the verification address signals $VA_1$ and $VA_2$ ($VB_1$ and $VB_2$), respectively. Conversely, in a non-verification mode ($C_1$="0"), the transfer gates 803 and 805 are turned ON and the transfer gates 804 and 806 are turned OFF, and therefore, the external address signals $A_1'$ and $A_2'$ ($B_1'$ and $B_2'$) pass through the transfer gates 803 and 805, respectively. As a result, the address signals $A_1$ and $A_2$ ($B_1$ and $B_2$) are the same as the external address signals $A_1'$ and $A_2'$ ($B_1'$ and $B_2'$), respectively.

Figure 6:
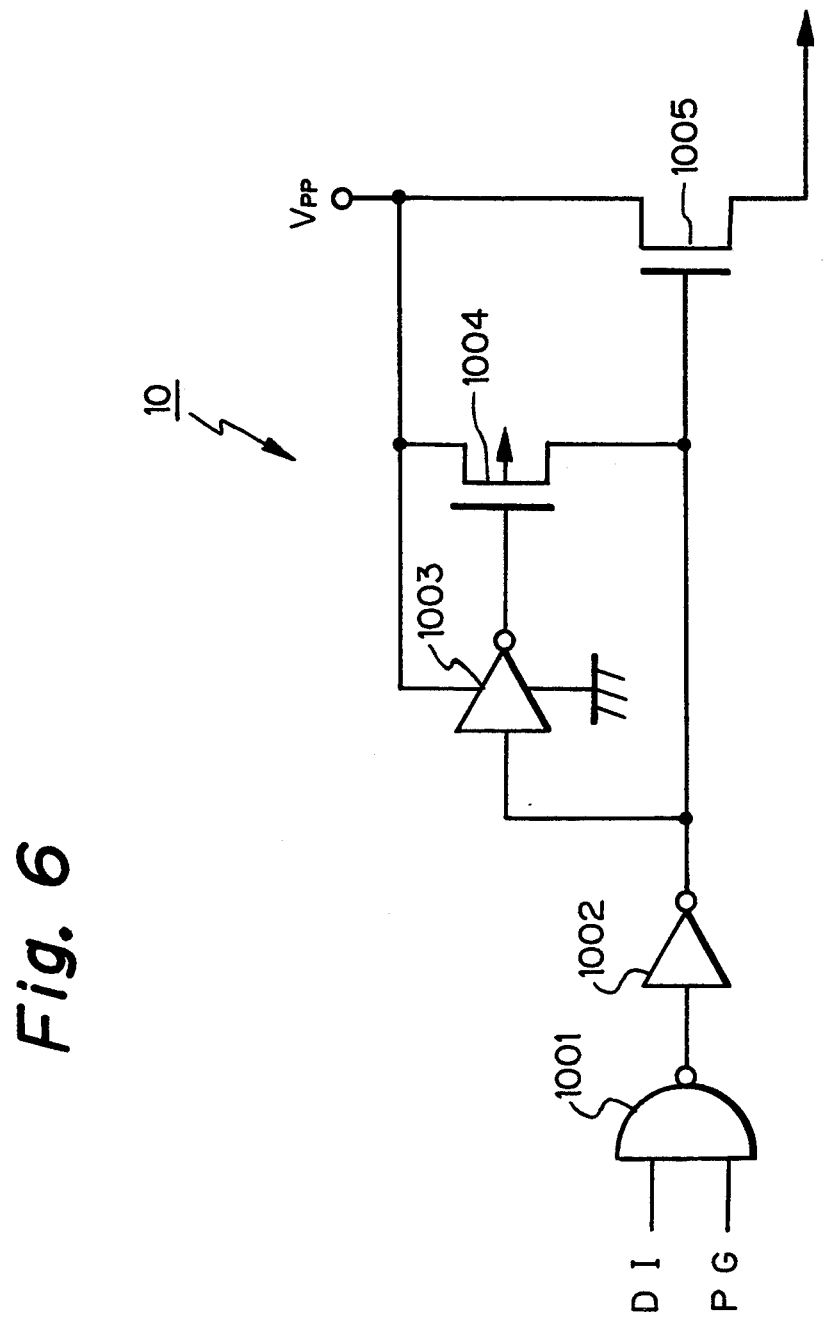
FIG. 6 is a circuit diagram of the write amplifier of FIG. 1.

In FIG. 6, which is a detailed circuit diagram of the write amplifier 10 of FIG. 1, this write amplifier 10 includes a NAND circuit 1001 for receiving the program signal PG and an input data DI, an inverter 1002, an inverter 1003 powered by the voltage $V_{pp}$, a P-channel enhancement type transistor 1004, and an N-channel enhancement type transistor 1005. That is, only when both of the inputs DI and PG of the NAND circuit 1001 are high, is the source of the transistor 1005 made high ($=V_{pp}$), thus carrying out a write operation.

Figure 7:
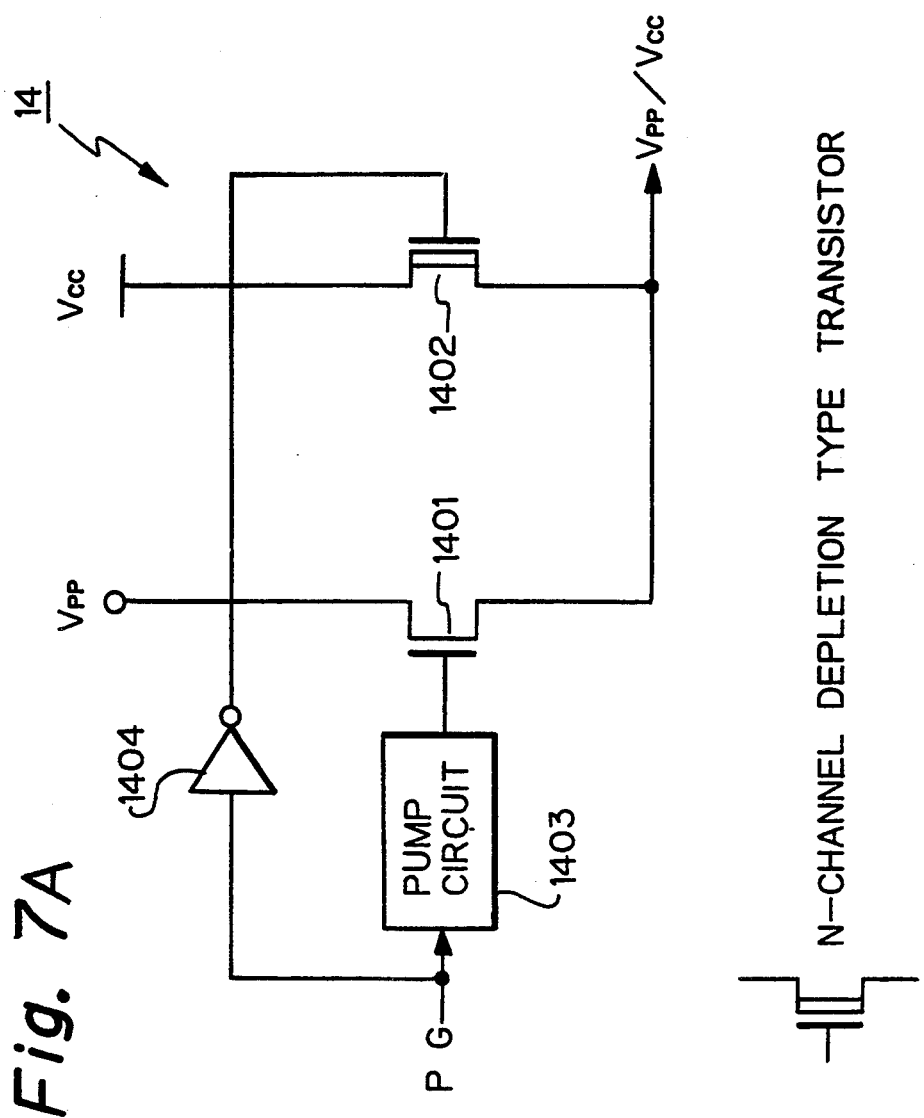
FIG. 7 is a circuit diagram of the $V_{pp}V_{cc}$ voltage generating circuit of FIG. 1.

In FIG. 7, which is a detailed circuit diagram of the $V_{pp}/V_{cc}$ voltage generating circuit 14 of FIG. 1, this circuit 14 includes an N-channel enhancement type transistor 1401 connected to a high voltage supply $V_{pp}$ such as 12 V, and an N-channel depletion type transistor 1402 connected to a voltage supply $V_{cc}$ such as 5 V. The transistor 1401 is controlled by a pump circuit 1403 which generates a high voltage higher than $V_{pp}$, while the transistor 1402 is controlled by an inverter 1404. The pump circuit 1403 and the inverter 1404 are both controlled by the control signal PG. If PG="1", the pump circuit 1403 is enabled to turn ON the transistor 1401, so that the voltage $V_{pp}/V_{cc}$ equals $V_{pp}$. Contrary to this, if PG="0", the output of the inverter 1402 is made high ($=V_{cc}$) to turn ON the transistor 1402, so that the voltage $V_{pp}/V_{cc}$ equals $V_{cc}$.

The erasing and verifying operation of the control circuit 13 of FIG. 1 is explained with reference to FIG. 8.

At step 1301, a flash erase operation is performed upon all of the memory cell $C_{11}$, $C_{12}$, ..., $C_{44}$. That is, the erase signal ER, the program signal PG and the verification control signal $C_1$ are

ER="1"
PG="1"
$C_1$="0".

As a result, as explained above, in the memory cells $C_{11}$, $C_{12}$, ..., $C_{44}$, the voltages at the sources are high ($=V_{pp}$), the voltages at the gates are 0 V, and the drains are in a floating state. This state is maintained for a predetermined time period, so that the electrons at the floating gates are expelled therefrom, so as to reduce the threshold voltages of the memory cells. Then, the control proceeds to step 1302.

At step 1302, a verification address VADD is initialized, i.e.,

VADD=0.

Note that the verification address VADD is represented by ($VA_1$, $VA_2$, $VB_1$, $VB_2$). Therefore, VADD =0 means that ($VA_1$, $VA_2$, $VB_1$, $VB_2$)=(0, 0, 0, 0). The verification address VADD is output to the row address switching circuit 8 and the column address switching circuit 9. Then, the control proceeds to step 1303.

At step 1303, a verifying operation is performed upon the memory cell indicated by the verification address VADD. That is, in this case, the erase signal ER, the program signal PG, and the verification control signal $C_1$ are

ER="0"
PG="0"
$C_1$="1".

As a result, data is read out of the memory cell indicated by the verification address ADD, and is transmitted via the sense amplifier 11 to the verification circuit 12.

Then, at step 1304, it is determined whether or not the verification output signal VO of the verification circuit 12 is "1" i.e., whether or not an erase operation performed upon the memory cell indicated by the verification address VADD is normally completed. As a result if VO="1" the control proceeds to step 1305. Otherwise, the control proceeds to step 1307.

At step 1305, it is determined whether or not the verification address VADD reaches a maximum value MAX such as decimal 15 which corresponds to ($VA_1$, $VA_2$, $VB_1$, $VB_2$)=(1, 1, 1, 1). As a result, if VADD<MAX, the control proceed to step 1306 which increments the verification address VADD by 1, and then, the control returns to step 1303, thus repeating the above-mentioned process. Otherwise, i.e., if VADD$\geq$ MAX, the control proceeds to step 1308, thus completing this routine.

Note that, if all of the memory cells $C_{11}$, $C_{12}$, ..., $C_{44}$ are completely erased by one flash erase operation, the flow at steps 1303 through 1306 is repeated sixteen times.

On the other hand, at step 1307, a flash erase operation is again performed upon all of the memory cells $C_{11}$, $C_{12}$, ..., $C_{44}$ in the same way as step 1301. Then, the control returns to step 1303, thus repeating the abovementioned process. In this case, note that, since the verification address VADD is not initialized, the flow at steps 1303 through 1306 is carried out fewer times as compared with the prior art where the verification address VADD is initialized.

Figure 8:
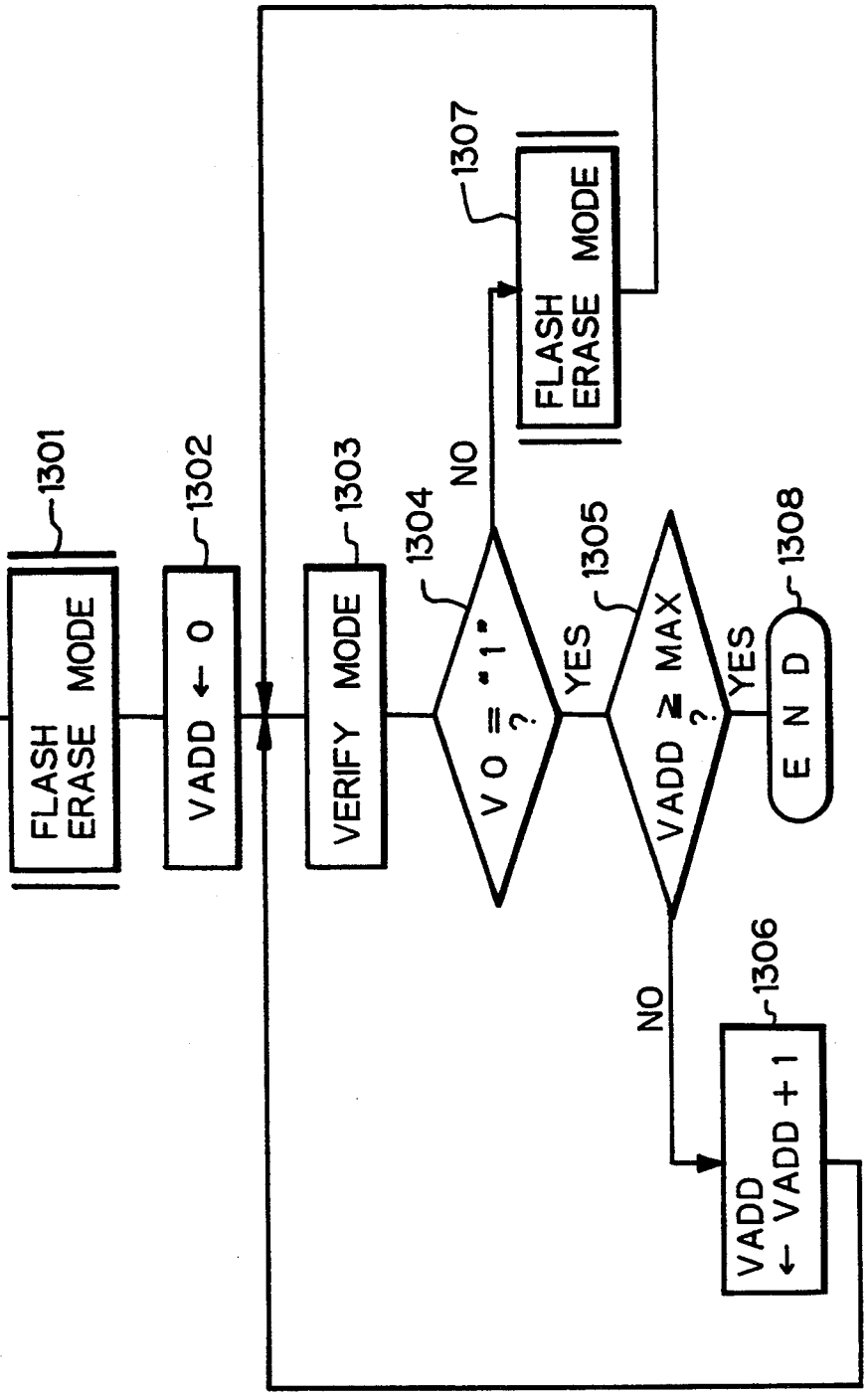
FIGS. 8 and 9 are flowcharts showing the operation of the control circuit of FIG. 1.
Figure 9:
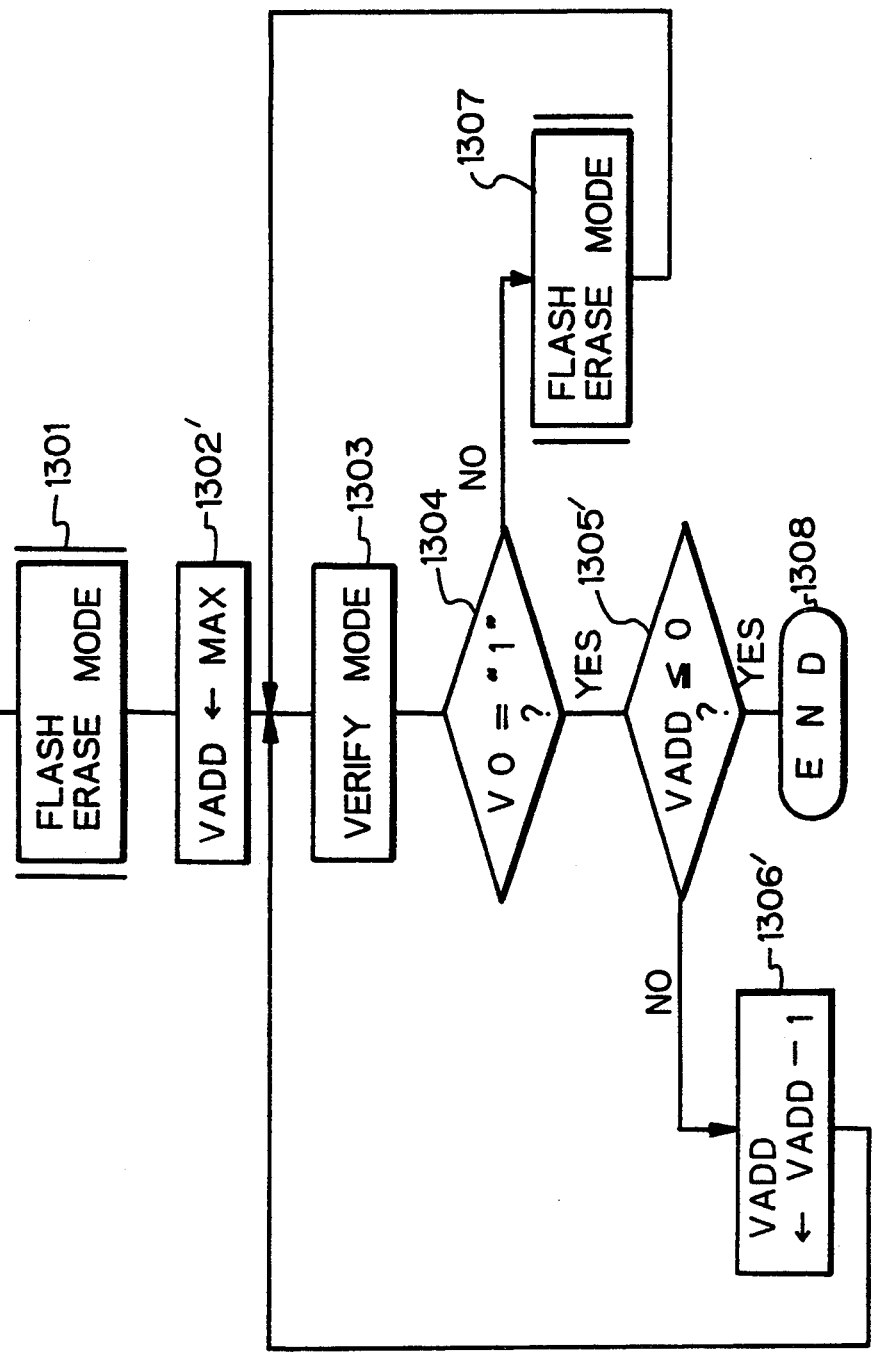

In FIG. 9, which is a modification of FIG. 8, steps 1302', 1305' and 1306' are provided instead of steps 1302, 1305 and 1306, respectively, of FIG. 8. In this case, the verification address VADD is initialized at the maximum value MAX such as 15. Then, during a verification operation, the verification address VADD is decremented by 1. Finally, when the verification address VADD reaches 0, the verifying operation is completed.

Figure 10:
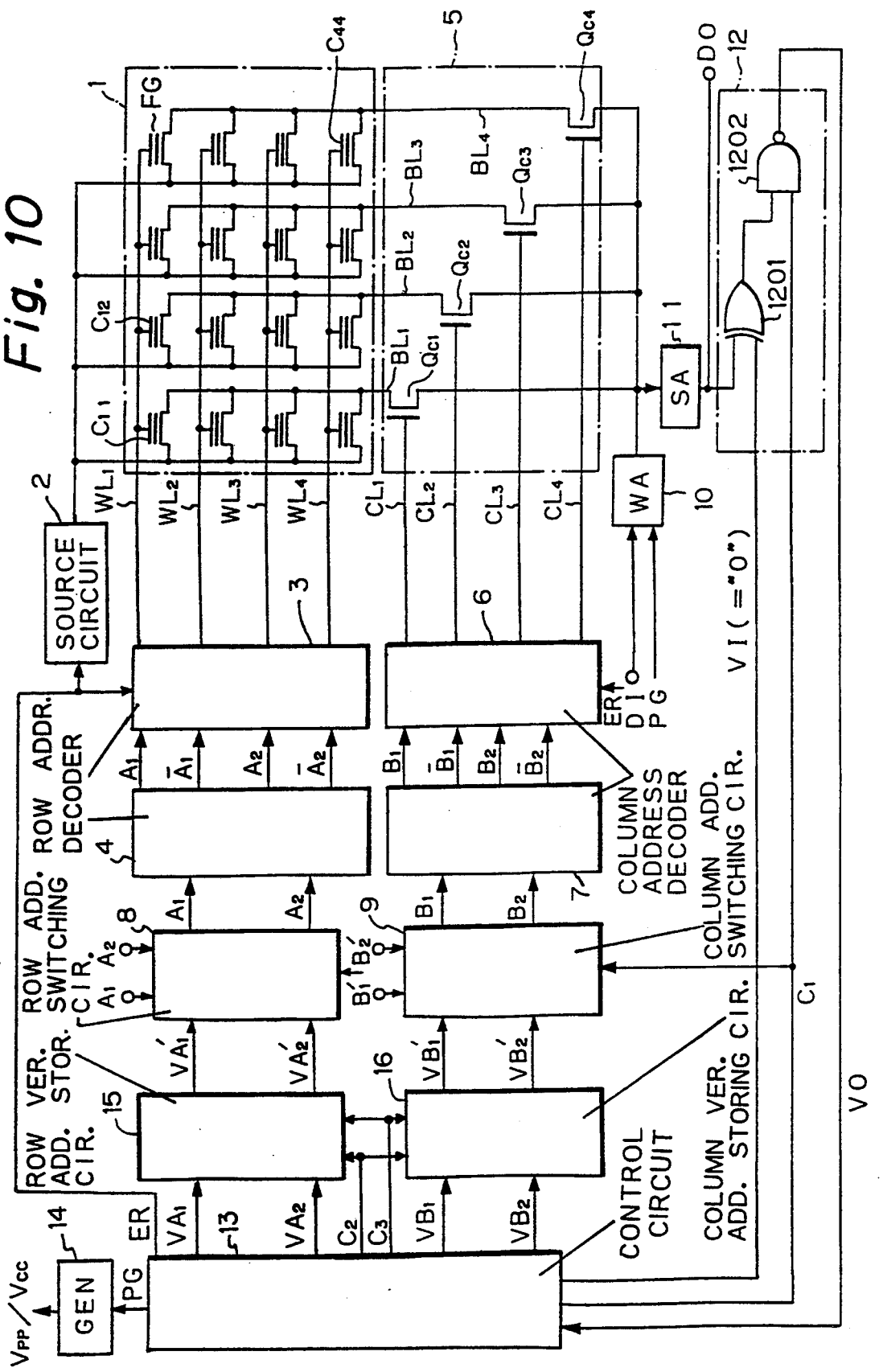
FIG. 10 is a block circuit diagram illustrating a nonvolatile semiconductor memory device to which a second embodiment according to the present invention is applied.

In FIG. 10, which is a block circuit diagram illustrating a nonvolatile semiconductor device to which a second embodiment of the present invention is applied, a row verification address storing circuit 15 is inserted between the control circuit 13 and the row address switching circuit 8, and a column verification address storing circuit 16 is inserted between the control circuit 13 and the column address switching circuit 9.

The verification address storing circuits 15 and 16 are controlled by storing control signals $C_2$ and $C_3$ generated from the control circuit 13. For example, if the storing control signals $C_2$ and $C_3$ are "1" and "0", respectively, the verification address storing circuits 15 and 16 pass the row verification address signals $VA_1$, $VA_2$ and the column verification address signals $VB_1$ and $VB_2$ therethrough. That is, $VA_1' = VA_1$
$VA_2' = VA_2$
$VB_1' = VB_1$
$VB_2' = VB_2$ Conversely, if the storing control signals $C_2$ and $C_3$ equal "1", the verification address storing circuits 15 and 16 store the row verification address signals $VA_1$ and $VA_2$ and the column verification address signals $VB_1$ and $VB_2$ therein. That is, in FIG. 10, when a flash erase operation is incompletely carried out so that the verification output signal VO of the verification circuit 12 is "0", the verification address VADD is stored in the verification address storing circuits 15 and 16.

Figure 11:
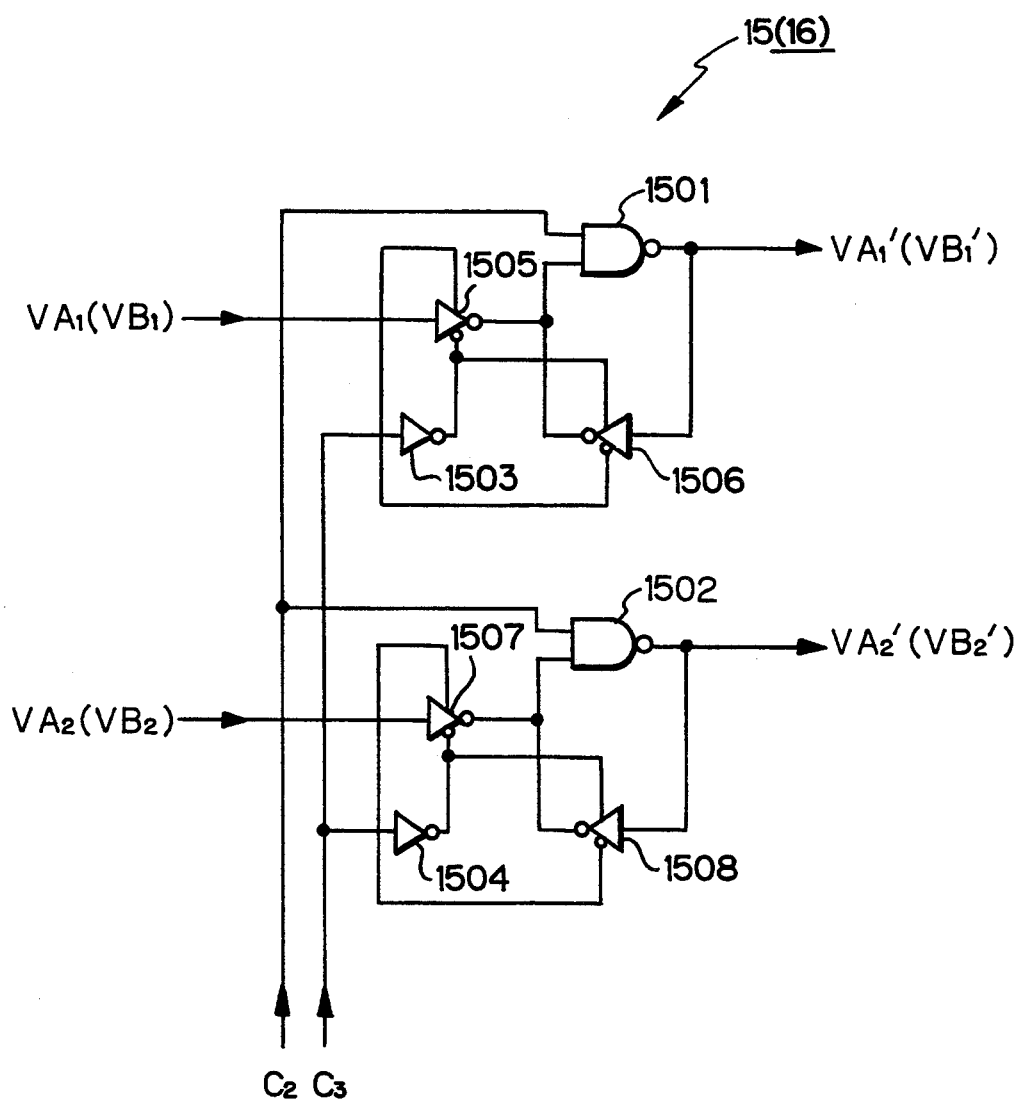
FIG. 11 is a circuit diagram of the erase address storing circuit of FIG. 10.

In FIG. 11, which is a detailed circuit diagram of the row verification address storing circuit 15 (the column verification address storing circuit 16) of FIG. 10, this circuit 15 (16) includes NAND circuits 1501 and 1502 controlled by the storing control signal $C_2$, inverters 1503 and 1504 for receiving the storing control signal $C_3$, and transfer gates 1505, 1506, 1507 and 1508 controlled by the storing control signal $C_3$ and its inverted signal. That is, if $C_2 =$ "1" and $C_3 =$ "0", the transfer gates 1505 and 1507 are turned ON and the transfer gates 1506 and 1508 are turned OFF, so that the verification address signals $VA_1$ ($VB_1$) and $VA_2$ ($VB_2$) pass through the NAND circuits 1501 and 1502. Therefore, $VA_1'(VB_1') = VA_1(VB_1)$
$VA_2'(VB_2') = VA_2(VB_2)$ Conversely, if $C_2 = C_3 =$ "1", the transfer gates 1505 and 1507 are turned OFF and the transfer gates 1506 and 1508 are turned ON, so that the verification address signals $VA_1$ ($VB_1$) and $VA_2$ ($VB_2$) do not pass through the NAND circuits 1501 and 1502. In this case, the outputs of the NAND circuits 1501 and 1502 are fed back via the transfer gates 1506 and 1508 to the inputs of the NAND circuits 1501 and 1502. Therefore, the verification address signals $VA_1'$ ($VB_1'$) and $VA_2'$ ($VB_2'$) are stored or latched in the NAND circuits 1501 and 1502.

Figure 12:
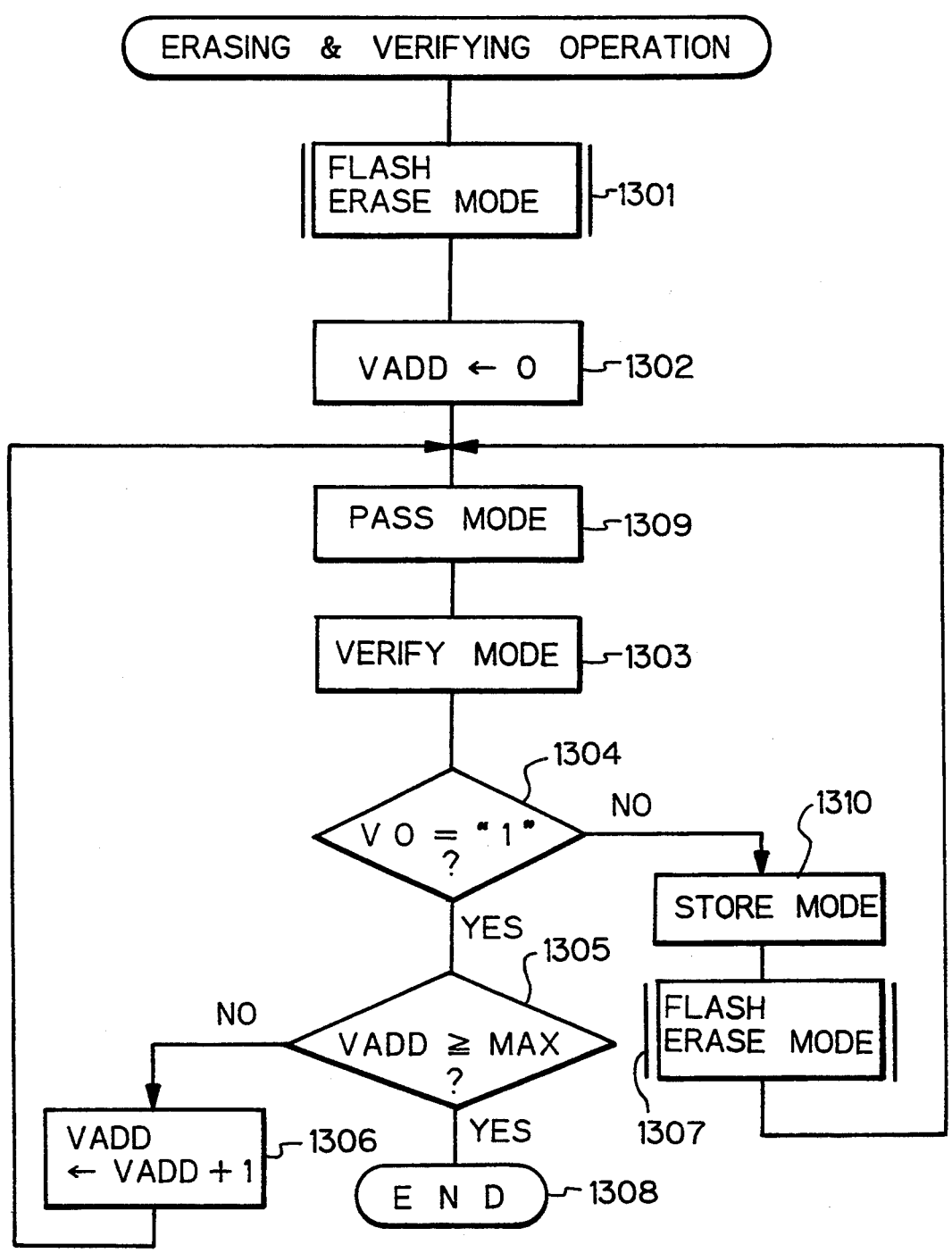
FIGS. 12 and 13 are flowcharts showing the operation of the control circuit of FIG. 10.
Figure 13:
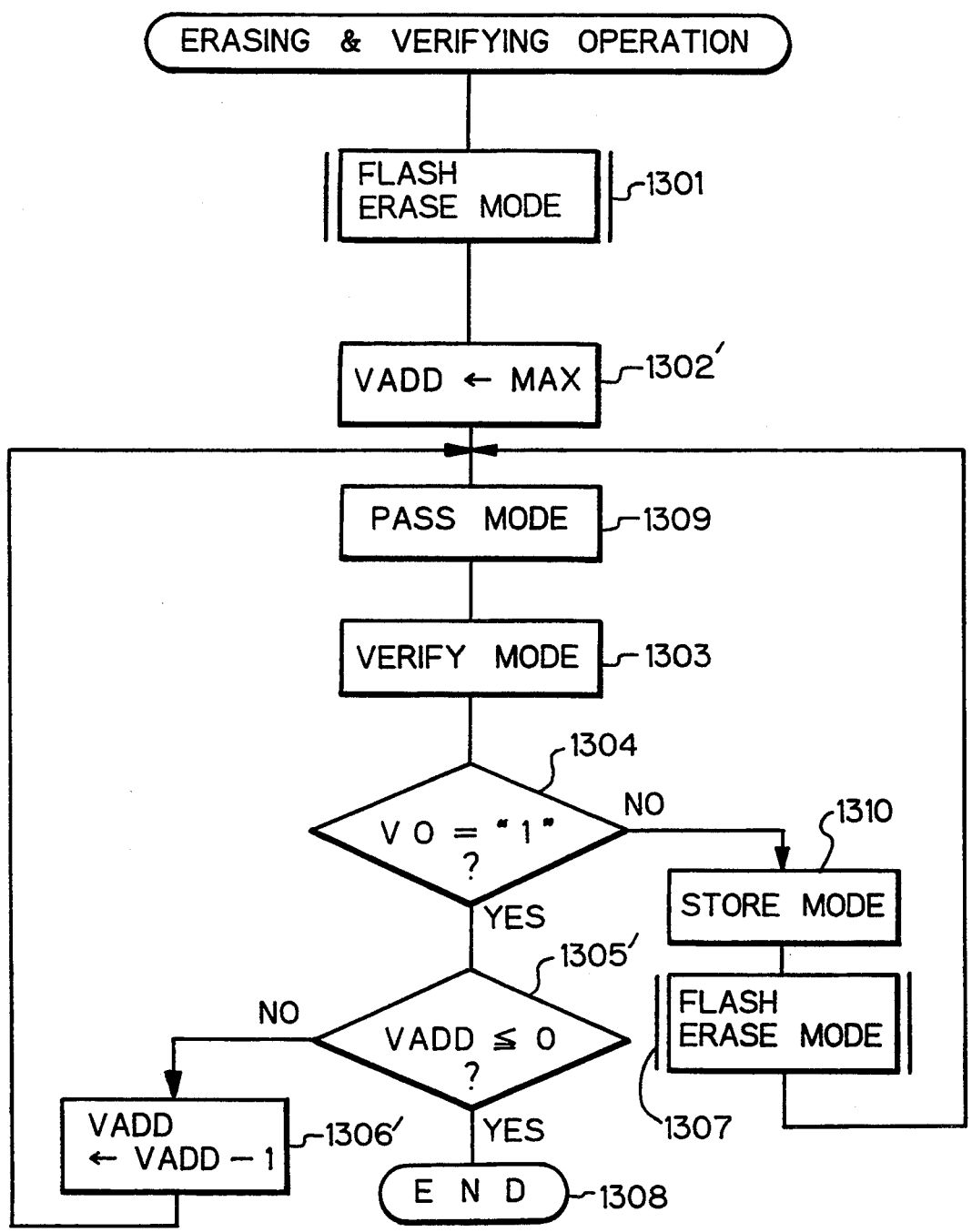

The erasing and verifying operation of the control circuit 14 of FIG. 10 is shown in FIGS. 12 and 13 which correspond to FIGS. 8 and 9, respectively. In FIGS. 12 and 13, steps 1309 and 1310 are added to FIGS. 8 and 9, respectively. That is, before entering a verify mode at step 1303, at step 1309, the storing control signals $C_2$ and $C_3$ are made "1" and "0", respectively, so that the verification address VADD ($VA_1$, $VA_2$, $VB_1$, $VB_2$) can pass through the verification address storing circuits 15 and 16. Also, before entering a flash erase mode at step 1307, at step 1310, the storing control signals $C_2$ and $C_3$ are both made "1", so that the verification address VADD ($VA_1'$, $VA_2'$, $VB_1'$, $VB_2'$) is stored or latched in the verification address storing circuits 15 and 16. Thus, also in this case, since the verification address VADD is not initialized, the flow at steps 1309, 1303 through 1306 is carried out fewer times as compared with the prior art where the verification address VADD is initialized.

In the above-mentioned embodiments, although a flash erase operation is performed upon all of the memory cells, the present invention can be applied to the case where a flash erase operation is performed upon a predetermined number of the memory cells such as a sector (block) of the memory cells.

As explained hereinbefore, according to the present invention, since a verification address is not initialized even after an additional flash erase operation, a time required for an erasing and verifying operation in a nonvolatile semiconductor memory device can be reduced.

I claim:

1. A method for erasing and verifying a nonvolatile semiconductor memory device including nonvolatile memory cells, comprising the steps of:
   simultaneously erasing a predetermined number of said nonvolatile memory cells;
   generating a verification address;
   selecting and reading one of said nonvolatile memory cells in accordance with the verification address;
   verifying whether or not data read from a selected nonvolatile memory cell coincides with a predetermined value;
   renewing the verification address when the data read from said selected nonvolatile memory cell coincides with the predetermined value, to thereby repeat said verification address generating step; and
   simultaneously erasing the predetermined number of said nonvolatile memory cells when the data read from said selected nonvolatile memory cell does not coincide with the predetermined value, to thereby repeat said verifying step.

2. A method as set forth in claim 1, wherein said verification address renewing step comprises a step of incrementing the verification address by +1.

3. A method as set forth in claim 1, wherein said verification address renewing step comprises a step of decrementing the verification address by 1.

4. A method as set forth in claim 1, further comprising a step of storing the verification address when the data read from said selected nonvolatile memory cell does not coincide with the predetermined value.

5. A nonvolatile semiconductor memory device comprising:
   nonvolatile memory cells;
   means for simultaneously erasing a predetermined number of said nonvolatile memory cells;
   means for generating a verification address;
   means for selecting and reading one of said nonvolatile memory cells in accordance with the verification address;
   means for verifying whether or not data read from a selected nonvolatile memory cell coincides with a predetermined value;
   means for renewing the verification address when the data read from said selected nonvolatile memory cell coincides with the predetermined value, to thereby operate said verification address generating means and means for simultaneously erasing the predetermined number of said nonvolatile memory cells when the data read from said selected nonvolatile memory cell does not coincide with the predetermined value, to thereby operate said verifying means.

6. A device as set forth in claim 5, wherein said verification address renewing means comprises a means for incrementing the verification address by +1.

7. A device as set forth in claim 5, wherein said verification address renewing means comprises means for decrementing the verification address by 1.

8. A method as set forth in claim 5, further comprising means for storing the verification address when the data read from said selected nonvolatile memory cell does not coincide with the predetermined value.

9. A nonvolatile semiconductor memory device comprising:
   a plurality of nonvolatile memory cells;
   control means for generating a verification address;
   means, connected to said verification address generating means, for storing the verification address;
   means, connected to said verification address storing means, and said nonvolatile memory cells, for selecting one of said nonvolatile memory cells in accordance with the verification address from said verification address storing means to verify a selected nonvolatile memory cell;
   means, connected to said nonvolatile memory cells and said control means, for verifying whether or not data of the selected nonvolatile memory cell coincides with a predetermined value; and
   said control means passing the verification address through said verification address storing means to said selecting means when the data of the selected nonvolatile memory cell coincides with the predetermined value, and said control means storing the verification address in said verification address storing means when the data of the selected nonvolatile memory cell does not coincide with the predetermined value.

10. A device as set forth in claim 9, wherein said control means increments or decrements the verification address only when the data of the selected nonvolatile memory cell coincides with the determined value.

11. A nonvolatile semiconductor memory device comprising:
    a plurality of nonvolatile memory cells;
    a control circuit for generating a verification address;
    a verification address storing circuit, connected to said control circuit, for passing the verification address generated from said control circuit through said verification address storing circuit in a first state and for storing the verification address generated from said control circuit in a second state;
    an address switching circuit, connected to said verification address storing circuit and said control circuit, for receiving a verification address from said verification address storing circuit and an external address from the exterior to selectively transmit one of the verification address and the external address therethrough in accordance with a control signal from said control circuit;
    a selecting circuit, connected to said address switching circuit, said nonvolatile memory cells, and said control circuit, for selecting one of said nonvolatile memory cells and verifying it in accordance with the control signal of said control circuit;
    a verifying circuit, connected to said nonvolatile memory cells and said control circuit, for verifying whether or not data of a selected nonvolatile memory cell coincides with a predetermined value,
    said control circuit enabling said verification address storing circuit in the first state when the data of the selected nonvolatile memory cell coincides with the predetermined value, said control circuit enabling said verification address storing circuit in the second state when the data of the selected nonvolatile memory cell does not coincide with the predetermined value.

12. A device as set forth in claim 11, wherein said control circuit increments or decrements the verification address only when the data of the selected nonvolatile memory cell coincides with the predetermined value.

* * * * *